United States Patent
Faul et al.

(10) Patent No.: US 12,557,326 B2
(45) Date of Patent: Feb. 17, 2026

(54) TRANSISTOR DEVICE WITH HIGHLY DOPED SOURCE AND DRAIN REGIONS

(71) Applicant: Infineon Technologies AG, Neubiberg (DE)

(72) Inventors: Jürgen Faul, Radebeul (DE); Andreas Urban Bertl, Villach (AT); Ewa Kowalska, Dresden (DE); Henning Feick, Munich (DE)

(73) Assignee: Infineon Technologies AG, Neubiberg (DE)

( * ) Notice: Subject to any disclaimer, the term of this patent is extended or adjusted under 35 U.S.C. 154(b) by 356 days.

(21) Appl. No.: 18/458,489

(22) Filed: Aug. 30, 2023

(65) Prior Publication Data
US 2024/0097037 A1 Mar. 21, 2024

(30) Foreign Application Priority Data

Sep. 15, 2022 (EP) ..................................... 22195960

(51) Int. Cl.
*H10D 30/62* (2025.01)
*H10D 62/10* (2025.01)
*H10D 62/13* (2025.01)
*H10D 62/17* (2025.01)

(52) U.S. Cl.
CPC .............. *H10D 30/62* (2025.01); *H10D 62/10* (2025.01); *H10D 62/151* (2025.01); *H10D 62/235* (2025.01)

(58) Field of Classification Search
CPC ...................................................... H10D 30/62
USPC ......................................................... 257/213
See application file for complete search history.

(56) References Cited

U.S. PATENT DOCUMENTS

| | | | |
|---|---|---|---|
| 5,741,737 A | 4/1998 | Kachelmeier | |
| 5,926,714 A | 7/1999 | Gardner et al. | |
| 8,076,228 B2 | 12/2011 | Berthold et al. | |
| 2005/0106823 A1* | 5/2005 | Chu | H01L 21/26586 257/E21.345 |
| 2014/0084385 A1* | 3/2014 | Hoffmann | H10D 64/017 257/402 |

FOREIGN PATENT DOCUMENTS

JP S59121979 A 7/1984

\* cited by examiner

*Primary Examiner* — Ajay Arora
(74) *Attorney, Agent, or Firm* — Murphy, Bilak & Homiller, PLLC (57) ABSTRACT

A transistor device includes: a semiconductor substrate having a doping concentration of a first dopant type; a highly doped source region of a second dopant type formed in a first surface of the semiconductor substrate; a first highly doped drain region of the second dopant type formed in the first surface; a gate structure arranged on the first surface and including a gate electrode formed on the first surface; and a first lightly doped region formed in the first surface and extending from the highly doped source region under the gate electrode. A channel region extends between the first lightly doped region and the highly doped drain region. The channel region has an average doping level of the first dopant type of $n \times 10^x$ that varies by less than $0.5 \times n \times 10^x$ between the first lightly doped region and the highly doped drain region along the lateral direction parallel to the first surface.

23 Claims, 4 Drawing Sheets

TRANSISTOR DEVICE WITH HIGHLY DOPED SOURCE AND DRAIN REGIONS

BACKGROUND

Low frequency, or 1/f noise (also referred to as flicker noise), is a dominant noise source in field-effect transistors (such as MOSFET devices). While not wishing to be bound by theory, the 1/f noise may be caused by carriers, such as electrons or holes, being transiently trapped in the gate dielectric and/or the interface between the gate dielectric and the channel of the transistor. The random translocation of carriers into traps or defect centers, such as silicon dangling bonds, into the gate dielectric and back into the channel, may cause the current through the transistor to fluctuate, which manifests as 1/f noise.

The push towards smaller and faster semiconductor devices has increased the need to reduce 1/f noise. In an amplification circuit, the effect of 1/f noise may be partially reduced by using transistors having large device areas in the initial stages so that 1/f noise does not get amplified to the same extent as the signal in subsequent stages of an amplification circuit. This approach, however, may not prevent 1/f noise from being introduced at later amplification stages in the circuit where smaller transistors are used. Moreover, the dimensions to which such devices can be scaled down may be limited by the necessity for one or more large early stage transistors.

U.S. Pat. No. 8,076,228 B2 discloses a low noise transistor with a noise reducing agent which is introduced into the gate electrode and then moved into the gate dielectric. However, further low noise transistor devices are desirable.

SUMMARY

According to an embodiment of the invention, a transistor device is provided that comprises a semiconductor substrate having a doping concentration of a first dopant type, a highly doped source region of a second dopant type opposing the first dopant type formed in a first surface of the semiconductor substrate, a highly doped drain region of the second dopant type formed in the first surface of the semiconductor substrate, a gate structure arranged on the first surface and comprising a gate electrode formed on the first surface and a first lightly doped region of the second dopant type formed in the first surface and extending from the highly doped source region under the gate electrode. The semiconductor substrate provides a channel region extending between the first lightly doped region and the highly doped drain region, wherein the channel region has an average doping level of the first dopant type of $n \times 10^X$ that varies by less than $0.5 \times n \times 10^X$ along the lateral direction parallel to the first surface.

X lies within the range of 13 to 16 so that the average doping level of the first dopant type of the channel region lies within the range of $10^{13}$ to $10^{16}$. This average doping level of the first conductivity type varies in the channel region in lateral directions parallel to the first surface by less than $0.5 \times n \times 10^X$ between the first lightly doped region and the highly doped drain region.

In this transistor device, the highly doped drain region forms a junction with the semiconductor substrate only whereas the highly doped source region is in contact with or overlaps the first lightly doped region. The first lightly doped region may also be referred to as a LDD region (low doped diffusion region). The transistor device has an abrupt junction between the highly doped drain region and the channel region since a lightly doped region is only arranged between the highly doped source region and the channel region. The transistor device can be considered to be an asymmetric device. In some embodiments, the transistor device is an asymmetric CMOS device.

Since the channel region has an average doping level of the first dopant type of $n \times 10^X$ that varies by less than $0.5 \times n \times 10^X$ along a lateral direction that is parallel to the first surface and between the first lightly doped region and the highly doped drain region, the transistor device does not have a graded channel region and the channel region has substantially the same doping level from the first lightly doped region to the highly doped drain region. Furthermore, the transistor device does not have a halo implant.

A transistor device is provided that has a reduced Cgg (total capacitance seen at the gate) and Cgd (gate drain capacitance) so as to reduce input related noise level, the flicker noise level and provide white noise improvement required by higher Gm/Id (transconductance dc drain current ratio). This is achieved by omitting a low-doped-diffusion region (LDD) on drain side of the device so that an abrupt junction is formed between the highly doped drain region and the semiconductor substrate. The transistor device is suitable for use in applications in which the operating voltage Vds<supply voltage Vdd (or nominal supply voltage of technology node). Examples of applications are analogue microphone applications, source follower mode operation, a VCO (Voltage Controlled Operator) operating below supply voltage Vdd, and devices operating near threshold (e.g. Vg~Vt) in saturation mode (Vgs-Vt)<Vds, for example.

In some embodiments, the gate electrode overlaps the first lightly doped region.

In some embodiments, the gate structure further comprises a gate insulating layer arranged between the gate electrode and the first surface of the semiconductor substrate, the gate insulating layer having a first thickness d1. The gate insulating layer may also be called a gate dielectric layer. The gate insulating layer may be formed of an oxide, for example silicon oxide. The gate electrode is electrically conductive and may be formed of polysilicon for example.

The gate insulating layer is in direct contact with the first surface of the semiconductor substrate and with the lower surface of the gate electrode. The gate electrode may have a substantially planar upper surface and a substantially planar lower surface and have a thickness that is substantially the same along its length.

The highly doped source region, the first lightly doped region and the highly doped drain region may have the opposing conductive type, e.g. n-type, to the semiconductor substrate, which may, for example be p-type the if highly doped source region, the first lightly doped region and the highly doped drain region are n-type.

The semiconductor substrate may be formed of silicon, for example monocrystalline silicon or a silicon epitaxial layer formed on a base substrate.

According to an embodiment of the invention, a transistor device comprises a semiconductor substrate having a doping concentration of first dopant type, a highly doped source region of a second dopant type opposing the first dopant type formed in a first surface of the semiconductor substrate and a highly doped drain region of the second dopant type formed in the first surface of the semiconductor substrate. The semiconductor substrate provides a channel region between the highly doped source region and the highly doped drain region. The transistor device further comprises a gate structure arranged on the first surface. The gate structure comprises a gate insulating layer having a thickness d1 arranged on the first surface, a gate electrode formed on the gate insulating layer and comprising a field plate extension extending from the gate electrode towards the highly doped drain region and an extension insulating layer having a second thickness d2 that is greater than the first thickness d1. The field plate extension is spaced apart from the first surface by the extension insulating layer. A transition is formed between the gate insulating layer and the extension insulating layer. The transition is laterally spaced apart from the highly doped drain region by a distance I.

This transistor device can be considered to be an asymmetric device, since the gate electrode includes a field plate on the drain side only.

The transition between the thinner gate insulating layer and the thicker extension insulating layer may have the form of a step or sudden increase in the thickness of the insulating layer arranged on the first surface. The position of the transition is also the position of a transition or step between the gate electrode and the field plate extension. The transition or step is positioned on the channel region.

In some embodiments, the upper surface of the gate electrode and the upper surface of the field plate extension are substantially coplanar. In these embodiments, the thickness of the field plate extension is less than the thickness of the gate electrode. The transition or step is also the transition of step in the thickness of the conductive material providing the gate electrode/field plate structure. The gate length corresponds to the length of the conductive material that is spaced apart from the first surface of the semiconductor substrate by the gate insulating layer with the thickness d1. The length of the field plate extension corresponds to the length of the conductive material that is spaced apart from the first surface of the semiconductor substrate by the extension insulating layer with the thickness d2.

Since the transition is laterally spaced apart from the highly doped drain region by a distance I, the transition is positioned vertically above the channel region with the inversion layer of the transistor device rather than above the highly doped drain region or a lightly doped drain region such as a LDD drain extension.

A transistor device is provided that has a reduced Cgg and Cgd so as to the reduce input related noise level, the flicker noise level and provide white noise improvement required by higher Gm/Id. This is achieved by including a field plate extension on the drain side of the gate electrode. The transistor device is suitable for use in applications in which the operating voltage Vds<supply voltage Vdd (or nominal supply voltage of technology node). Examples of applications are analogue microphone applications, source follower mode operation, a VCO (Voltage Controlled Operator) operating below supply voltage Vdd, and devices operating near threshold (e.g. Vg~Vt) in saturation mode (Vgs−Vt)<Vds, for example.

In some embodiments, the field plate extension at least partially overlaps the highly doped drain region.

In some embodiments, both the highly doped source region and highly doped drain region are in contact with the semiconductor substrate only.

The semiconductor substrate provides a channel region between the highly doped source region and the highly doped drain region. In some embodiments, the channel region has an average doping level of the first dopant type of $n \times 10^x$ that varies by less than $0.5 \times n \times 10^X$ between the highly doped source region and the highly doped drain region along lateral directions parallel to the first surface. X lies within the range of 13 to 16 so that the average doping level of the channel region lies within the range of $10^{13}$ to $10^{16}$. For an average doping level of $5 \times 10^{15}$, the variation may be between 0 and $2.5 \times 10^{15}$.

Since the channel region has an average doping level of $n \times 10^x$ that varies by less than $0.5 \times n \times 10^X$ between the first lightly doped region and the highly doped drain region in lateral directions parallel to the first surface, the transistor device does not have a graded channel region and the channel region has substantially the same doping level from the first lightly doped region to the highly doped drain region. Furthermore, the transistor device does not have a halo implant.

In some embodiments, the distance I between the transition and the highly doped drain region is 0 nm<I≤1 μm, or 0 nm<I≤250 nm, or 10 nm≤I≤250 nm or 50 nm≤I≤250 nm or 100 nm≤I≤225 nm.

In some embodiments, the transistor device further comprises a first lightly doped region of the second dopant type formed in the first surface and extending from the highly doped source region under the gate electrode. The first lightly doped region is, therefore, positioned under a source sided end of the gate electrode only and is spaced apart from the highly doped drain region by a channel region having an average doping level of the first dopant type of $n \times 10^x$ that varies by less than $0.5 \times n \times 10^X$ between the lightly doped source region and the highly doped drain region along lateral directions parallel to the first surface.

In some embodiments, the transistor device further comprises a second lightly doped region of the second dopant type extending from the highly doped drain region under the field plate extension. In these embodiments, the transition is still spaced apart from the second lightly doped region by a portion of the channel region. The transition is, therefore, arranged vertically above the channel region and not above the second lightly doped region. The second lightly doped region is, therefore, positioned under a drain sided end of the field plate extension only and is spaced apart from the highly doped source region or from the first lightly doped region, if present, by the channel region having an average doping level of the first dopant type of $n \times 10^x$ that varies by less than $0.5 \times n \times 10^X$.

In some embodiments, the transistor device further comprises a noise reduction agent in the gate insulating layer and/or at the first surface of the semiconductor substrate. In some embodiments, the noise reduction agent is arranged in the semiconductor substrate in a layer immediately below the first surface.

In some embodiments, the noise reduction agent comprises fluorine ions.

In some embodiments, the transistor device further comprises spacers arranged on side faces of the gate structure. For example, a spacer can be arranged on opposing sides faces of the gate electrode. In embodiments including a drain-sided field plate extension, a spacer is arranged on the source-sided side face of the gate electrode and on the drain-sided side face of the field plate extension. The noise reduction agent may be introduced laterally adjacent to the spacers and move into the gate insulating layer that is arranged under the spacers and under the gate electrode.

In some embodiments, the transistor device further comprises a first well comprising the first dopant type. The first well is formed in the first surface and is electrically insulated from the remainder of the semiconductor substrate. The highly doped source region and the highly doped drain region comprise the second dopant type and are positioned in the first well.

In this embodiment, the first well and the semiconductor substrate in which it is formed have the same conductivity type. This embodiment may be used to fabricate, for example, one or more p channel devices, e.g. pfets, in a p-doped substrate material, The p channel devices can be built in a triple well to isolate device body from substrate. This has the benefit that the device body can be independently biased. An isolated triple well may be formed by n-isolation implant and n-type sinker/wells to connect to a deep isolation band which is n-doped and isolate laterally the p-doped well from p-doped substrate.

In some embodiments, the first well is electrically insulated from the semiconductor substrate by one or more electrically insulating trenches or sinkers of the second dopant type extending into the semiconductor substrate from the first surface and by a lateral insulating layer of the second dopant type arranged under the first well.

In some embodiments, the trenches or the sinkers extend into the semiconductor substrate from the first surface and in some embodiments laterally surround and continuously surround the well and the transistor device(s) formed therein. The lateral insulating layer may extend between the trenches or sinkers.

In some embodiments, the transistor device further a second well of the second dopant type and a further transistor device formed in the second well, wherein the second well is electrically insulated from the semiconductor substrate. The further transistor device comprises a highly doped source region of the first dopant type formed in the first surface of the second well, a highly doped drain region of the first dopant type formed in the well and a gate structure comprising a gate electrode formed on the first surface above the second well.

In some embodiments, the second well is electrically insulated from the semiconductor substrate by one or more electrically insulating trenches or damaged regions extending into the semiconductor substrate from the first surface and by a lateral insulating layer arranged under the second well. The damaged regions comprise material of the semiconductor substrate that is crystallographically damaged, e.g. disrupted, and electrically insulating.

This embodiment may be used to fabricate a n channel device on a p-doped substrate, for example. On a p-doped substrate material, n channel devices, e.g. nfets, can be built in a triple well to isolate the device body from the substrate. n-channel device(s) and p-channel device(s) can be formed in the same semiconductor substrate.

In some embodiments, the second well and the further transistor device formed therein is electrically insulated from the semiconductor substrate.

In some embodiments, the trenches extend into the semiconductor substrate from the first surface and in some embodiments laterally surround and continuously surround the second well and the transistor device(s) formed therein. The lateral insulating layer may extend between the trenches.

In some embodiments, the transistor device is a pMOS or nMOS device, for example a p-channel CMOS device or n-channel CMOS device.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, various dopant types, device types and/or doped semiconductor regions may be identified as being of n type or p type, but this is merely for convenience of description and not intended to be limiting, and such identification may be replaced by the more general description of being of a "first dopant or conductivity type" or a "second, opposite dopant or conductivity type" where the first type may be either n or p type and the second type then is either p or n type.

The Figures illustrate relative doping concentrations by indicating "−" or "+" next to the doping type "n" or "p". For example, "n⁻" means a doping concentration which is lower than the doping concentration of an "n"-doping region while an "n⁺"-doping region has a higher doping concentration than an "n"-doping region. Doping regions of the same relative doping concentration do not necessarily have the same absolute doping concentration. For example, two different "n"-doping regions may have the same or different absolute doping concentrations.

The invention provides asymmetric CMOS devices which are suitable for use in analogue microphone applications and aims to reducing Cgg and Cgd so as to the reduce input related noise level, the flicker noise level and provide white noise improvement required by higher Gm/Id. The CMOS transistor devices are provided with low gate to drain capacitance for specific application spaces by one or both of omitting a low-doped-diffusion region (LDD) on drain side of the device and introducing a thick oxide region on drain side of the device.

The devices are suitable for use in applications in which the operating voltage Vds is less than the supply voltage Vdd (or nominal supply voltage of technology node). Examples of applications are source follower mode operation, a VCO (Voltage Controlled Operator) operating below supply voltage Vdd, devices operating near threshold (e.g. Vg~Vt) in saturation mode (Vgs−Vt)<Vds, devices formed as halo free devices, i.e. no localized channel doping implanted, as the halo not required due to above operating conditions, i.e. low voltages are applied, devices in analog operation with channel length above minimum design length as there is little punch through risk due to longer channel lengths employed.

In some embodiments, Cgd is reduced or minimized by employing an abrupt drain junction with low overlap. Hot carrier degradation is not an issue due to above operation conditions. An abrupt drain side junction between the highly doped drain region and the channel and a lightly doped region is used on source side only. A low drain overlap is uncritical for device performance since device operates in saturation mode (channel pinched off near drain side in saturation). The device can be formed as either thick or thin oxide device.

In some embodiments, a reduction in Cgd is obtained by implementing a thick gate oxide on top of drain junction. The step or transition between the thin gate dielectric, typically an oxide, and the field plate electrically insulating layer is located not on a drain extension region, e.g. LDD, but over inversion layer and on the channel region of the device. The field electrically insulating layer can be a thick dual gate oxide.

Both approaches may be combined and further combined with a fluorine implant after gate structuring to further reduce flicker noise. The fluorine implant can be performed after gate side wall formation and/or spacer formation.

In the transistor devices described herein no halo implant is used as there is no short channel effect. Consequently, there is no graded doping along the channel is used and, in embodiments including a well, well doping is also not graded along channel. Consequently, the channel region has an average doping level of $n \times 10^X$ that varies by less than $0.5 \times n \times 10^X$ between the first lightly doped region and the highly doped drain region so that the transistor device does not have a graded channel region and the channel region has substantially the same doping level from the first lightly doped region to the highly doped drain region. X lies within the range of 13 to 16 so that the average doping level of the channel region lies within the range of $10^{13}$ to $10^{16}$.

Figure 1:
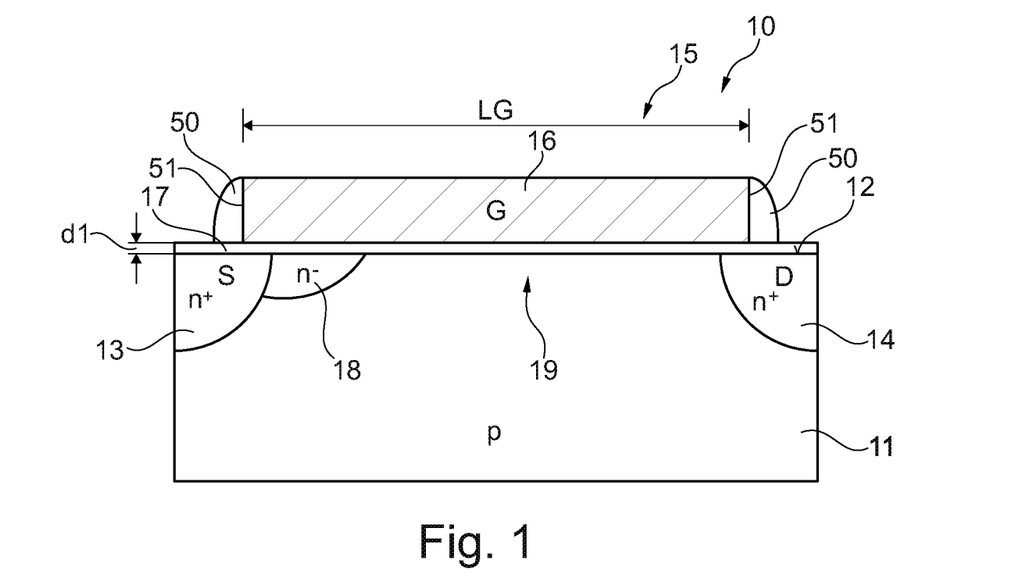
FIG. 1 illustrates a transistor device according to an embodiment.

FIG. 1 illustrates a transistor device 10 according to an embodiment. The transistor device 10 comprises a semiconductor substrate 11 having a first surface 12 and a doping concentration of a first dopant type, for example of $n \times 10^X$, where X lies within the range of 13 to 16 so that the average doping level of the substrate 11 lies within $10^{13}$ to $10^{16}$.

The transistor device 10 comprises a highly doped source region 13 of a second dopant type that opposes the first dopant type. The highly doped source region 13 is formed in the first surface 12 of the semiconductor substrate 11. The transistor device 10 also comprises a highly doped drain region 14 of the second dopant type which is formed in the first surface 12 of the semiconductor substrate 11. The highly doped source region 13 and the high doped drain region 14 extend to the first surface 12 and are laterally spaced apart from one another by an intervening region of the semiconductor substrate 11. The highly doped source region 13 and the highly doped drain region 14 have a doping concentration which is higher than the doping concentration of the semiconductor substrate 11.

The transistor device 10 further comprises a gate structure 15 which is formed on the first surface 12 and which comprises a gate electrode 16 which is formed on the first surface 12 and which has a length $L_G$. The gate electrode 16 is electrically conductive and is spaced apart from the first surface 12 by a gate dielectric layer 17 which has a thickness d1. In this embodiment, the gate electrode 16 is substantially planar, i.e. has an upper and lower surface that are substantially parallel to the first surface 12, and has a substantially uniform thickness. The gate electrode 16 has a length $L_G$ such that a first distal end overlaps the highly doped source region 13 and the first lightly doped region 18 and the highly doped drain region.

The transistor device 10 further comprises a first lightly doped region 18 of the second dopant type which is formed in the first surface 12 and which extends from the highly doped source region 13 under the gate electrode 16 in the direction of the highly doped drain region 14. The first lightly doped region 18 extends to the first surface and overlaps the source sided end of the gate electrode 16. The first lightly doped region 18 can be referred to as a source extension. The first lightly doped region 18 may be formed by implantation and diffusion and be referred to as a first LDD region. The first lightly doped region 18 is laterally spaced apart from the highly doped drain region 14 by a channel region 19 that has an average doping level of the first dopant type of $n \times 10^X$, where X lies within the range of 13 to 16 so that the average doping level of the channel region 19 lies within $10^{13}$ to $10^{16}$.

The highly doped drain region 14 is in contact with the semiconductor substrate 11 only and does not include a lightly doped region. The transistor device 10 can be considered to be an asymmetric device. In some embodiments, the transistor device 10 is a CMOS device.

The highly doped source region 13, the first lightly doped region 18 and the highly doped drain region 14 are doped with the second dopant type that opposes the first dopant type of the semiconductor substrate 11. For example, the semiconductor substrate 11 may be p type and the highly doped source region 13, the first lightly doped region 18 and the highly doped drain region 14 be n-type or vice versa. The highly doped drain region 14, therefore, only forms an abrupt pn junction with the semiconductor substrate 11, whereas the highly doped source region 13 forms a graded junction, due to the first lightly doped region 18 arranged between the highly doped source region 13 and the semiconductor substrate 11.

The channel region 19 is formed between the first lightly doped region 18 and the highly doped drain region 14 and has an average doping level of the first dopant type of $n \times 10^X$, where X lies within the range of 13 to 16 so that the average doping level of the channel region 19 lies within $10^{13}$ to $10^{16}$. In this region of the semiconductor substrate 11 laterally extending between the first lightly doped region 18 and the highly doped drain region 14, the doping level of the channel region 19 varies by less than $0.5 \times n \times 10^X$, along a lateral direction parallel to the first surface 12 of the semiconductor substrate 11 between the first lightly doped region 18 and the highly doped drain region 14. In other words, the channel region 19 does not include a graded doped structure and does not include a halo implant. In some embodiments, the doping level of the channel region 19 is the same as the doping level of the semiconductor substrate 11.

The highly doped source region 13 has a doping level which is greater than the doping level of the first lightly doped region 18. The highly doped drain region 14. has a doping level which is greater than the doping level of the first lightly doped region 18 and may be substantially the same as the highly doped source region 13.

A spacer 50 may be arranged on side faces 51 of the gate electrode 16. The spacers 50 may be formed of electrically insulating material, such as an oxide, for example silicon oxide.

Figure 2:
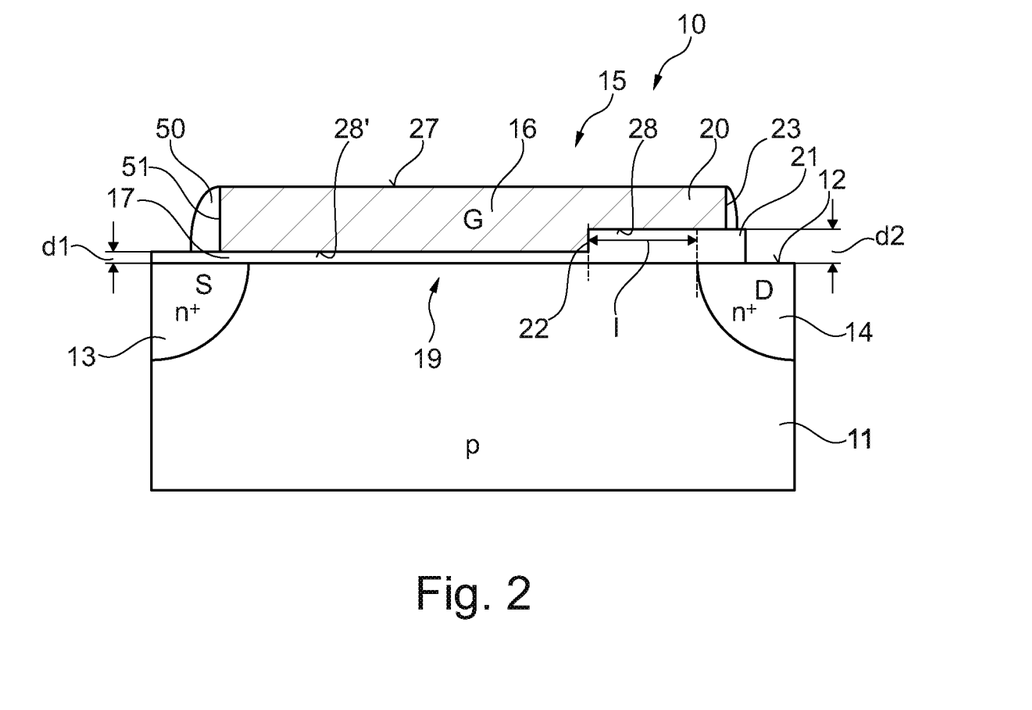
FIG. 2 illustrates a transistor device in according to an embodiment.

FIG. 2 illustrates a transistor device 10 according to another embodiment which, similar to the embodiment described with reference to FIG. 1, comprises a semiconductor substrate 11 having a first surface 12 and an average doping level of a first dopant type of $n \times 10^X$, where X lies within the range of 13 to 16 so that the average doping level of the substrate 11 lies within $10^{13}$ to $10^{16}$. A highly doped source region 13 is formed in the first surface 12 and a highly doped drain region 14 formed in the first surface 12 and spaced apart laterally apart from the highly doped source region 13. A channel region 19 is formed in the semiconductor substrate 11 between the highly doped source region 13 and the highly doped drain region 14. As in the embodiment illustrated in FIG. 1, a gate structure 15 is arranged on the first surface 12 which comprises a gate electrode 16 which is formed on a gate dielectric layer 17 having a thickness d1.

In the transistor device 10 illustrated in FIG. 2, the gate electrode 16 further comprises a field plate extension 20 which extends from the gate electrode 16 towards the highly doped drain region 14. The distal end 23 of the conductive field plate extension 20 overlaps the highly doped drain region 14. The gate electrode 16 and the field plate extension 20 each have an upper surface 27 which are substantially coplanar substantially parallel to the first surface 12. The field plate extension 20 has a thickness which is less than the thickness of the gate electrode 16 and has a lower surface 28, which opposes the upper surface 27, which is spaced apart from the first surface 12 by distance d2 which is greater than the distance d1 between the lower surface 28' of the gate electrode 16 and the first surface 12 of the semiconductor substrate 11.

The gate electrode structure 15 comprises an extension insulating layer 21 which is positioned between the field plate extension 20 and the first surface 12 and, therefore, has a thickness d2 which is greater than the thickness d1 of the gate dielectric 17. A transition 22 or step is formed between the gate insulating layer 17 having a thickness d1 and the extension insulating layer 21 having a thickness d2. The lower surface 28, 28' has a transition 22 or step defining the lateral extent of the gate electrode 16 and its transition into the field plate extension 20. The transition 22 is laterally spaced apart from the highly doped drain region 14 by a distance I and is located on the channel region 19. The transition 22 is positioned between the highly doped source region 13 and the highly doped drain region 14 so as to laterally space the gate dielectric layer 17 apart from the highly doped drain region 14 by the distance I.

In some embodiments, similar to the embodiment illustrated in FIG. 1, the channel region 19 may have an average doping level of the first dopant type of $n \times 10^x$ that varies by less than $0.5 \times n \times 10^X$ in a lateral direction parallel to the first surface 12 of the semiconductor substrate 11 between the highly doped source region 13 and the highly doped drain region 14. The channel region 19 does not have a graded doping level and is without a halo implant. In this embodiment, both the highly doped source region 13 and the highly doped drain region 14 have an abrupt junction to the semiconductor substrate 11 since no lightly doped region is included between the highly doped source region 13 and the substrate 11 nor between the highly doped drain region 14 and the substrate 11. The structure is an asymmetric structure due to the use of the field plate extension 20 on the drain side of the gate electrode 15 only.

In some embodiments, the transition or step 22 between the gate insulating layer 17 and the extension insulating layer 21 is spaced apart from the highly doped drain region 14 by a distance of I of 0 nm<I≤250 nm, or 10 nm≤I≤250 nm or 50 nm≤I≤250 nm or 100 nm≤I≤225 nm so that it is positioned on the channel region 19.

A spacer 50 may be arranged on the side face 51 of the gate electrode 16 and on the side face 23 of the field plate extension 20. The spacers 50 may be formed of electrically insulating material, such as an oxide, for example silicon oxide.

Figure 3:
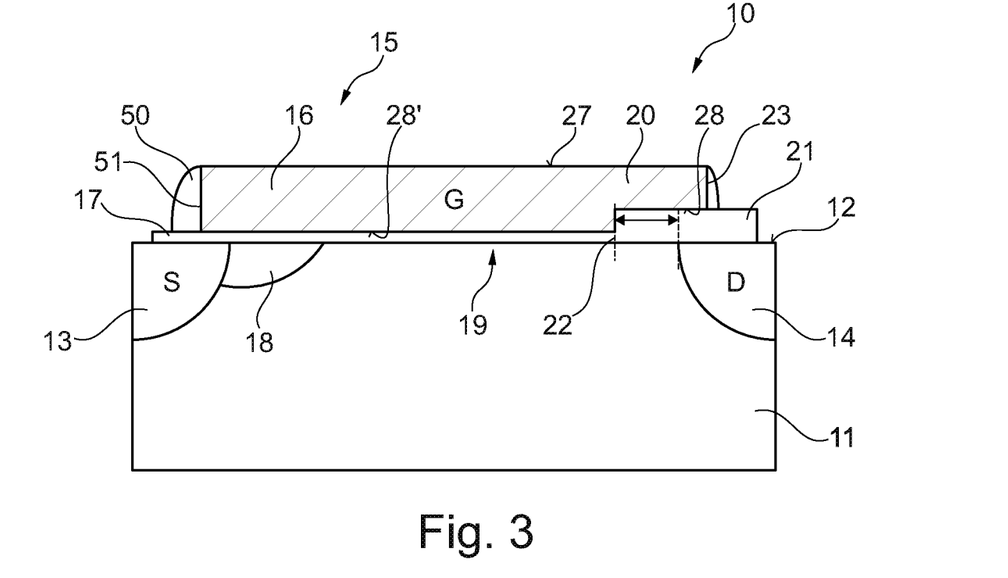
FIG. 3 illustrates a transistor device according to an embodiment.

FIG. 3 illustrates a transistor device 10 which is similar to that illustrated in FIGS. 1 and 2 and which comprises a combination of the first lightly doped region 18 which extends from the highly doped source region 13 under the gate electrode 16 in the direction of the highly doped drain region 14, as described with reference to FIG. 1, and the field plate extension 20 on the drain side of the gate electrode 16, as described with reference to FIG. 2. The lower surface 28 of the field plate extension 20 is spaced apart from the first surface 12 by the extension insulating layer 21 which has a thickness d2 which is greater than the thickness d1 of the gate dielectric layer 17 positioned between the lower surface 28' of the gate electrode 16 and the first surface 12. The transition 22 between the gate dielectric layer 17 and the extension insulating layer 21 is laterally spaced apart from the highly doped drain region 14 in a direction towards the first lightly doped region 18 by a distance I. The transition 22 is also spaced apart laterally from the first lightly doped region 18 and is positioned on the channel region 19.

In some embodiments, similar to the embodiment illustrated in FIG. 1, the channel region 19 may have an average doping level of the first dopant type of $n \times 10^x$ that varies by less than $0.5 \times n \times 10X$ along a lateral direction parallel to the first surface 12 of the semiconductor substrate 11 between the first lightly doped region 18 and the highly doped drain region 14. The channel region 19 does not have a graded doping level and is without a halo implant.

Figure 4:
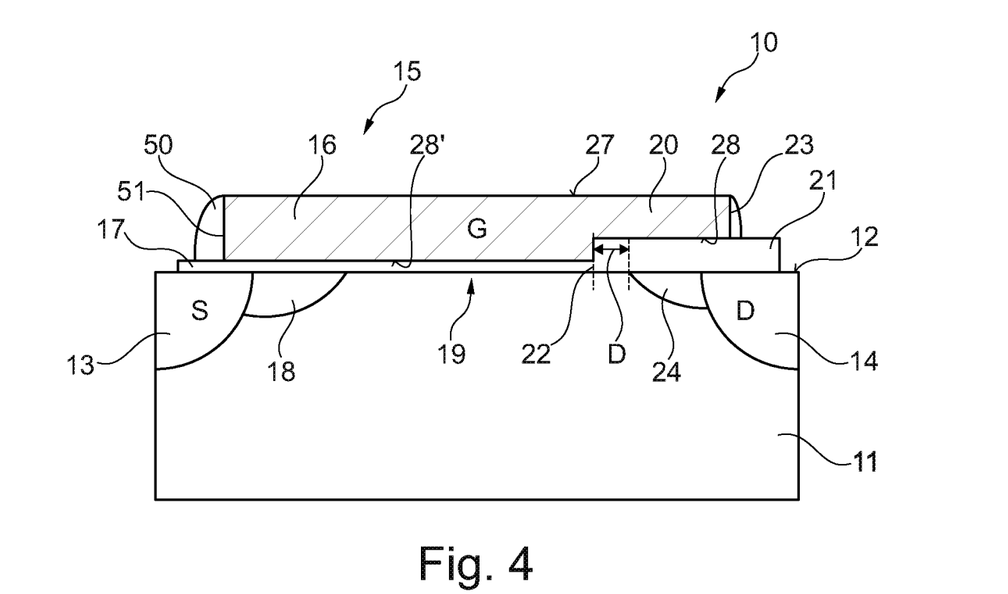
FIG. 4 illustrates a transistor device according to an embodiment.

FIG. 4 illustrates a transistor device 10 which differs from that illustrated in FIG. 3 in that the transistor device 10 further includes a second lightly doped region 24 which extends from the highly doped drain region 14 towards the highly doped source region 13. The lightly doped second lightly doped region 24 is laterally spaced apart from the transition 22 between the gate electrode 16 and the field plate extension 20 and between the gate dielectric 17 and the extension insulating layer 22 by a distance D. The distance D may be smaller than the distance L of the embodiment illustrated in FIG. 2. The field plate extension 20 extends over the second lightly doped region 24 and the side face is poisoned above the highly doped drain region 14. The length of the field plate extension 20 may be larger than the length of the field plate extension 20 of the embodiment illustrated in FIG. 3. The transition 22 is positioned on the channel region 19 which is formed laterally between the first and second lightly doped regions 18, 24.

In some embodiments, similar to the embodiment illustrated in FIG. 3, the channel region 19 may have an average doping level of the first dopant type of $n \times 10^x$ that varies by less than $0.5 \times n \times 10X$ along a lateral direction parallel to the first surface 12 of the semiconductor substrate 11 between the first lightly doped region 18 and the second lightly doped region 24. The channel region 19 does not have a graded doping level and is without a halo implant.

In the embodiments illustrated in FIGS. 1 to 4, the semiconductor substrate 11 comprises a first conductivity type, e.g. p-type, and the highly doped source region 13 and the highly doped drain region 14 comprises a second conductivity type, e.g. n type, which opposes the first conductivity type. The transistor device 10 illustrated in FIGS. 1 to 4 may be an p-type device, such as a PMOS device.

Figure 5:
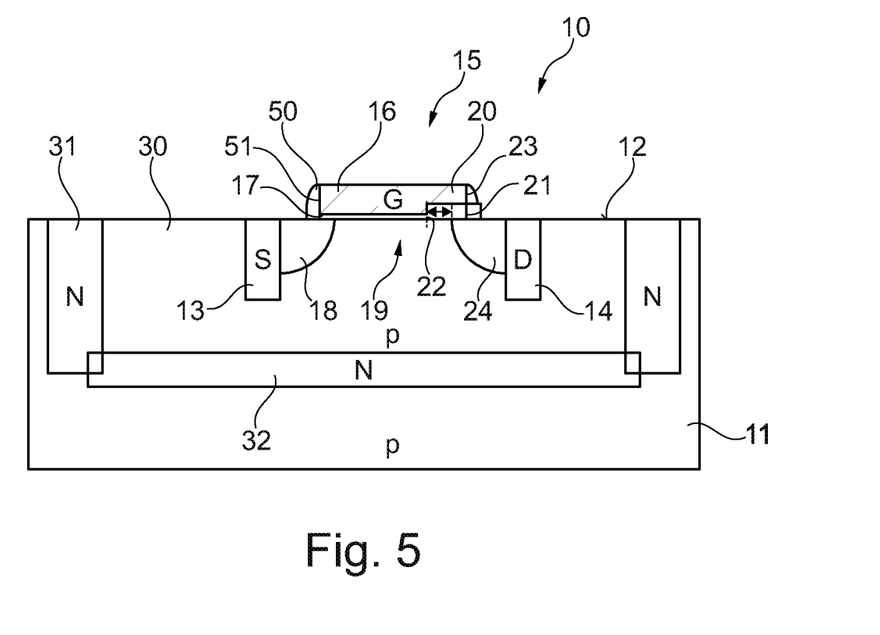
FIG. 5 illustrates a transistor device according to an embodiment.

FIG. 5 illustrates an example of a transistor device 10 which is PMOS device. The transistor device 10 is located in a well 30 of the second conductivity type which is formed in a substrate 11 also of the second conductivity type. The well 30 is formed in the first surface 12 and extends from the first surface 12 into the semiconductor substrate 11. The highly doped source region 13, the highly doped drain region 14 and the gate structure 15 and, therefore the structure forming the transistor device 10 are positioned in the well 30.

The well 30 and the transistor device 10 formed therein is electrically insulated from the semiconductor substrate 11.

This electrical insulation of the well 30 from the remainder of the semiconductor substrate 11 may be used if the transistor device 10 is to have a different body potential to the semiconductor substrate 11 and any other devices formed in the semiconductor substrate. The transistor device 10 is shown in FIG. 5 as having a similar structure to the transistor device 10 illustrated in FIG. 4. The structure differs in that the side face 23 of the field plate extension is positioned on the second lightly doped region 24. However, the transistor device 10 may have the structure of any one of the embodiments described herein.

In some embodiments, the well 30 and transistor device 10 are electrically insulated from the semiconductor substrate 11 by one or more electrically insulating trenches 31 which extend into the semiconductor substrate 11 from the first surface 12 and by a lateral electrically insulating layer 32 which is arranged under the well 30. The lateral electrically insulating layer 32 is positioned within the body of the semiconductor substrate 11 may be referred to as a buried layer. In some embodiments, the electrically insulating trench 31 laterally continuously surrounds the device area 33 in which the transistor device 10' is formed and contacts the electrically insulating layer 32 at its periphery. The trenches 31 may overlap the insulating layer 32. This arrangement delimits the well 30 from the semiconductor substrate 11.

In some embodiments, the trench 31 is filled with electrically insulating material and the lateral layer 32 is electrically insulating. In some embodiments, the trench 31 and the buried lateral layer 32 comprise a material of the opposing conductivity type to the conductivity type of the well 30 and the semiconductor substrate 11. For example, the trench 31 may be formed by a trench filled with material doped with the first conductivity type, e.g. n-type, and the buried layer 32 also be of the first conductivity type, whereas the well 30 and the semiconductor substrate 11 are of the second conductivity type, e.g. p-type. In other embodiments, the trench structure may be formed of a region of the semiconductor substrate 11 that is doped with the opposing conductivity type to the conductivity type of the semiconductor substrate 11 rather than have the form of a trench formed by removal of the material of the semiconductor substrate 11 that is filled with a different material that is either electrically insulating or electrically conductive.

In some embodiments, a transistor device is provided in which the well 30 comprises the opposing conductivity type to the semiconductor substrate 11 and is electrically insulated from the semiconductor substrate 11 by the buried layer 32 and a trench 31 that has a continuous ring-shape and that overlaps the buried layer 32. For example, the well 30 may comprise the first dopant type, i.e. be n-type, and the substrate 11 be p-type. In these embodiments, the transistor device formed in the well comprises a highly doped source region and a highly doped drain region of the second dopant type. A lightly doped source extension, if used, and a lightly doped drain extension, if used, are also of the second dopant type. The transistor device formed in the well may have the structure according to any one of the embodiments described herein, whereby the dopant types are selected accordingly, i.e. the highly doped source region, highly doped drain region of the second dopant type, lightly doped source extension, if used, and lightly doped drain extension, if used, comprise the opposing dopant type to the well and, therefore, the same dopant type as the substrate in which the well is formed. This embodiment may be used to fabricate a transistor device in the well 30 that has the opposing channel type to the substrate 11, for example a NMOS device in a p-type substrate 11. PMOS devices may be formed in other regions of the semiconductor substrate outside of the well which comprise the first dopant type.

Figure 6:
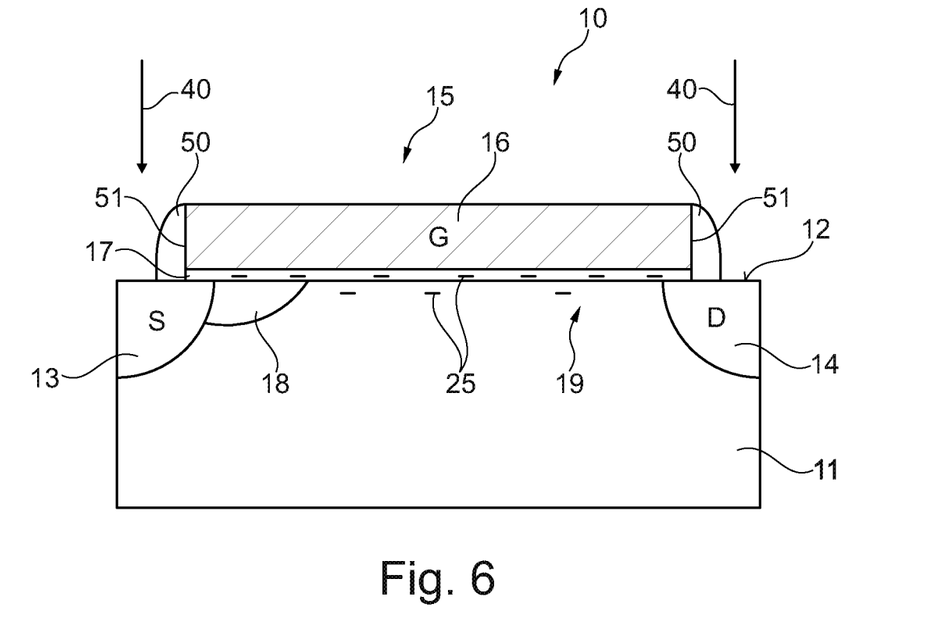
FIG. 6 illustrates a transistor device according to an embodiment.

FIG. 6 illustrates a transistor device 10 according to another embodiment. The transistor device 10 has a structure similar to that illustrated in FIG. 1 but differs in that it further comprises a noise reduction agent 25 which is positioned in the gate dielectric layer 17 which is positioned between the gate electrode 16 and the first surface 12. Alternatively, or in addition, the noise reduction agent 25 may be arranged at the first surface 12, in particular, in a portion of the semiconductor substrate 11 immediately adjacent the first surface 12. The noise reduction agent 25 may be formed by implanting fluorine ions into the first surface 12 in regions laterally adjacent to the gate electrode 16 as is indicated schematically in FIG. 6 by the arrows 26. The noise reduction agent is then moved into the gate dielectric layer 17, for example, by performing an annealing step.

A noise reduction agent may also be used in the transistor device of any one of the embodiments described herein.

Figure 7:
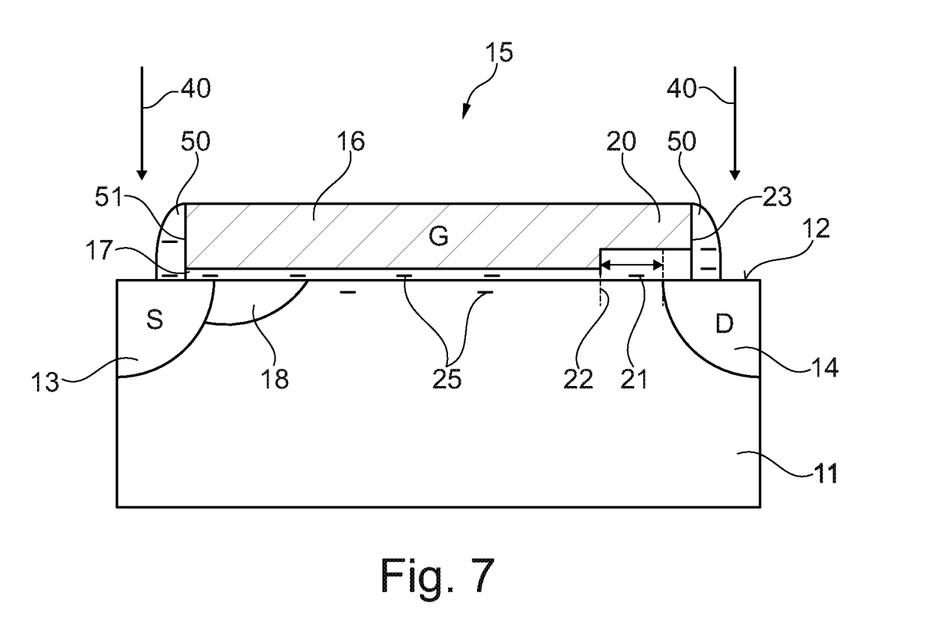
FIG. 7 illustrates a transistor device according to an embodiment.

FIG. 7 illustrates an embodiment in which the transistor device 10 similar to that illustrated in FIG. 2 and comprises spacers 50 which are arranged on side faces 51 of the gate structure 15 and in particular, on the side face 51 of the gate electrode 16 and the side face 23 of the field plate extension 20. The spacers 50 may be formed of electrically insulating material, such as an oxide, for example silicon oxide. In some embodiments, a noise reduction agent 25 may be introduced such that it is positioned in the spacers 50 in addition to the gate dielectric layer 17 and/or region of the semiconductor substrate 11 immediately adjoining the first surface 12. In embodiments in which the gate structure 15 includes a field plate extension 20 and an electrically insulating extension layer 21, the noise reduction agent may also be arranged in the electrically insulating extension layer 21.

The transistor device 10 illustrated inf FIGS. 2 to 5 and 7 which has a thin gate dielectric layer 17 and a thicker extension insulating layer 21 may be fabricated by dual gate oxides. In some embodiments, a thick gate oxide, i.e. with the thickness of at least d2 is deposited and selectively removed in areas designated to have a thin gate dielectric layer 17 using a masked wet etch. In some embodiments, a thin oxide layer, i.e. with the thickness d1 is deposited across wafer and a second insulating layer is selectively deposited in areas designated to have a field plate extension 21. Optionally, high-k gate dielectrics in place of an oxide may be used, for example in case of high-k metal gate processing.

Deposition of oxides for the gate insulating layer 17 and the extension insulating layer 21 may be deposited by oxide growth using thermal oxidation, e.g. furnace/rapid thermal processes or combinations thereof or deposition processes such as RTCVD, PECVD) and/or combinations with above methods. After formation of the gate structure, i.e. the gate insulating layer 17, extension layer 21 and gate electrode 16 including any field pale extension 20, various implants can be carried out post gate structuring, including extension implants (LDD) for forming the first and second lightly doped regions 18, 24 post side wall oxidation or thin spacer formation, heavy doped source/drain implants (HDD) 13, 14 and post thick spacer 50 formation. The noise reduction agent 25 may be introduced either at first or second position of the process. A fluorine (F) implant may be used. A doping activation anneal at 900° C. and above may be used followed by a conventional contact liner, contact and back end of line processing.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A transistor device, comprising:
a semiconductor substrate having a doping concentration of a first dopant type;
a highly doped source region of a second dopant type opposing the first dopant type formed in a first surface of the semiconductor substrate;
a highly doped drain region of the second dopant type formed in the first surface of the semiconductor substrate;
a gate structure arranged on the first surface and comprising a gate electrode formed on the first surface; and
a first lightly doped region of the second dopant type formed in the first surface and extending from the highly doped source region under the gate electrode,
wherein the semiconductor substrate provides a channel region extending between the first lightly doped region and the highly doped drain region,
wherein the channel region has an average doping level of the first dopant type of $n \times 10^x$ that varies by less than $0.5 \times n \times 10^X$ along the lateral direction parallel to the first surface.

2. The transistor device of claim 1, wherein the gate structure further comprises a gate insulating layer arranged between the gate electrode and the first surface, the gate insulating layer having a first thickness.

3. The transistor device of claim 1, further comprising a noise reduction agent in the gate insulating layer and/or at the first surface.

4. The transistor device of claim 3, wherein the noise reduction agent comprises fluorine ions.

5. The transistor device of claim 1, further comprising spacers arranged on side faces of the gate structure.

6. The transistor device of claim 1, further comprising a first well of the first dopant type, wherein the first well is electrically insulated from the semiconductor substrate, and wherein the highly doped source region and the highly doped drain region are positioned in the first well.

7. The transistor device of claim 6, wherein the first well is electrically insulated from the semiconductor substrate by one or more electrically insulating trenches or sinkers of the second dopant type extending into the semiconductor substrate from the first surface and by a lateral insulating layer of the second dopant type arranged under the first well.

8. The transistor device of claim 1, further comprising:
a second well of the second dopant type; and
a further transistor device formed in the second well,
wherein the second well is electrically insulated from the semiconductor substrate,
wherein the further transistor device comprises a highly doped source region of the first dopant type formed in the first surface of the second well, a highly doped drain region of the first dopant type formed in the second well, and a gate structure comprising a gate electrode formed on the first surface above the second well.

9. The transistor device of claim 8, wherein the second well is electrically insulated from the semiconductor substrate by one or more electrically insulating trenches or damaged regions extending into the semiconductor substrate from the first surface and by a lateral insulating layer of the second dopant type arranged under the second well.

10. The transistor device of claim 1, wherein the transistor device is a pMOS or nMOS device.

11. A transistor device, comprising:
a semiconductor substrate having a doping concentration of a first dopant type;
a highly doped source region of a second dopant type opposing the first dopant type formed in a first surface of the semiconductor substrate;
a highly doped drain region of the second dopant type formed in the first surface of the semiconductor substrate, wherein the semiconductor substrate provides a channel region between the highly doped source region and the highly doped drain region; and
a gate structure arranged on the first surface,
wherein the gate structure comprises:
a gate insulating layer having a thickness arranged on the first surface;
a gate electrode formed on the gate insulating layer and comprising a field plate extension extending from the gate electrode towards the highly doped drain region; and
an extension insulating layer having a second thickness that is greater than the first thickness, wherein the field plate extension is spaced apart from the first surface by the extension insulating layer and a transition is formed between the gate insulating layer and the extension insulating layer,
wherein the transition is laterally spaced apart from the highly doped drain region by a distance I.

12. The transistor device of claim 11, wherein the semiconductor substrate provides a channel region between the highly doped source region and the highly doped drain region, wherein the channel region has an average doping level of the first dopant type of $n \times 10^x$ that varies by less than $0.5 \times n \times 10^x$ between the highly doped source region and the highly doped drain region.

13. The transistor device of claim 12, wherein $0 \text{ nm} < I \leq 1 \text{ µm}$, or $0 \text{ nm} < I \leq 250 \text{ nm}$, or $10 \text{ nm} \leq I \leq 250 \text{ nm}$ or $50 \text{ nm} \leq I \leq 250 \text{ nm}$ or $100 \text{ nm} \leq I \leq 225 \text{ nm}$.

14. The transistor device of claim 11, further comprising a first lightly doped region of the second dopant type formed in the first surface and extending from the highly doped source region under the gate electrode.

15. The transistor device of claim 11, further comprising a second lightly doped region of the second dopant type extending from the highly doped drain region under the gate electrode.

16. The transistor device of claim 11, further comprising a noise reduction agent in the gate insulating layer and/or at the first surface.

17. The transistor device of claim 16, wherein the noise reduction agent comprises fluorine ions.

18. The transistor device of claim 11, further comprising spacers arranged on side faces of the gate structure.

19. The transistor device of claim 11, further comprising a first well of the first dopant type, wherein the first well is electrically insulated from the semiconductor substrate, and wherein the highly doped source region and the highly doped drain region are positioned in the first well.

20. The transistor device of claim 19, wherein the first well is electrically insulated from the semiconductor substrate by one or more electrically insulating trenches or sinkers of the second dopant type extending into the semiconductor substrate from the first surface and by a lateral insulating layer of the second dopant type arranged under the first well.

21. The transistor device of claim 11, further comprising:
a second well of the second dopant type; and
a further transistor device formed in the second well,
wherein the second well is electrically insulated from the semiconductor substrate,
wherein the further transistor device comprises a highly doped source region of the first dopant type formed in the first surface of the second well, a highly doped drain region of the first dopant type formed in the second well, and a gate structure comprising a gate electrode formed on the first surface above the second well.

22. The transistor device of claim 21, wherein the second well is electrically insulated from the semiconductor substrate by one or more electrically insulating trenches or damaged regions extending into the semiconductor substrate from the first surface and by a lateral insulating layer of the second dopant type arranged under the second well.

23. The transistor device of claim 11, wherein the transistor device is a pMOS or nMOS device.

* * * * *